(12) United States Patent
Lee et al.

(10) Patent No.: US 9,117,659 B2
(45) Date of Patent: Aug. 25, 2015

(54) METHOD OF FORMING THE BUFFER LAYER IN THE LTPS PRODUCTS

(71) Applicant: EverDisplay Optronics (Shanghai) Limited, Shanghai (CN)

(72) Inventors: YuanHsin Lee, Shanghai (CN); MinChing Hsu, Shanghai (CN)

(73) Assignee: EVERDISPLAY OPTRONICS (SHANGHAI) LIMITED, Shanghai (CN)

( * ) Notice: Subject to any disclaimer, the term of this patent is extended or adjusted under 35 U.S.C. 154(b) by 0 days.

(21) Appl. No.: 14/261,030

(22) Filed: Apr. 24, 2014

(65) Prior Publication Data
US 2014/0322905 A1    Oct. 30, 2014

(30) Foreign Application Priority Data
Apr. 24, 2013  (CN) .......................... 2013 1 0145646

(51) Int. Cl.
H01L 21/22   (2006.01)
H01L 21/38   (2006.01)
H01L 21/02   (2006.01)
H01L 27/12   (2006.01)

(52) U.S. Cl.
CPC .... H01L 21/02164 (2013.01); H01L 21/02052 (2013.01); H01L 27/127 (2013.01)

(58) Field of Classification Search
CPC .................. H01L 21/02041; H01L 21/02043; H01L 21/02052; H01L 21/02126; H01L 21/0217; H01L 21/02137; H01L 21/02282; H01L 21/02488; H01L 21/02554; H01L 21/02581; H01L 21/02631; H01L 21/2022; H01L 21/28017; H01L 21/28158; H01L 21/322; H01L 21/3221
USPC ......... 438/514, 517, 530, 542, 591, 765, 766, 438/FOR. 150, FOR. 154
See application file for complete search history.

(56) References Cited

U.S. PATENT DOCUMENTS

| 6,455,401 B1 * | 9/2002 | Zhang et al. ................ 438/486 |
| 2006/0017154 A1 * | 1/2006 | Eguchi et al. ................ 257/701 |
| 2010/0143707 A1 * | 6/2010 | Sasaoka et al. ............. 428/332 |
| 2012/0302016 A1 * | 11/2012 | Ma .............................. 438/197 |
| 2013/0001564 A1 * | 1/2013 | Choi et al. ..................... 257/59 |
| 2013/0032900 A1 | 2/2013 | Hou et al. |

FOREIGN PATENT DOCUMENTS

CN    1564308 A    1/2005

* cited by examiner

Primary Examiner — Kyoung Lee
Assistant Examiner — Joannie A Garcia
(74) Attorney, Agent, or Firm — Andrew F. Young, Esq.; Lackenbach Siegel, LLP

(57) ABSTRACT

The present disclosure disclosed a method of forming the buffer layer in the LTPS products. The method comprises the following steps: heating the substrate to make the alkali metal ions diffuse to the surface of the glass; washing the substrate by acid to remove the alkali metal ions on the surface of the glass; forming the buffer layer on the glass which has been heated and washed by acid, wherein the material of the buffer layer is SiOx. The method of the present disclosure based on the design of the single buffer layer, it can greatly promote the capacity and can economize the gas. Furthermore, it can avoid the cross contamination of the different layers so as to promote characteristic of the element.

9 Claims, 2 Drawing Sheets

METHOD OF FORMING THE BUFFER LAYER IN THE LTPS PRODUCTS

CROSS-REFERENCE TO RELATED APPLICATIONS

The present application claims priority to and the benefit of Chinese Patent Application No. CN 201310145646.4, filed on Apr. 24, 2013, the entire content of which is incorporated herein by reference.

BACKGROUND OF THE INVENTION

1. Field of the Invention

The present disclosure relates to the technology of producing the LTPS products, more specifically, to a method of forming the buffer layer in the LTPS products.

2. Description of the Related Art

The process of forming buffer layer of triple structure in Low Temperature Poly-silicon ("LTPS", hereinafter) products generally includes the following features:

The metal ions existing on the surface of the glass are mainly metal ions in Group I/II: K, Na, Ca, Mg, Ba and so on.

After the test of SIMS (secondary ion mass spectroscopy), the effect of utilizing the different insulating layer to separate the metal ions are that as follows:

when SiNx is used as the insulating layer, all the metal ions can be effectively separated to less than $10^{15}$ by a 500 Å SiNx insulating layer;

when just $SiO_2$ is used as the insulating layer, Ca, Ng, Ba can be effectively separated to less than $10^{15}$ by a 800 Å SiO2 insulating layer; however, the effect of separating the K ions and Na ions is poor that a 3000 Å of insulating layer is necessary to separate K ions and Na ions to less than $10^{15}$.

Metal ions on the surface of the glass will affect the performance of component devices. Hence, generally, it is necessary to use the insulating layer as the buffer layer for separating the metal ions in positive channel type Thin Film Transistor ("TFT", hereinafter).

SiNx is not as good as $SiO_2$ when contacting with photoresist/glass, it is easy to peel off. However, the effect of separating metal ions by $SiO_2$ is not as good as SiNx. Hence, presently, the method most widely used is to use the $SiO_2$/$SiN_x$/$SiO_2$ triple structure 6 according to FIG. 1. However, the triple structure will cause the defects of too many layers (which cause poor feature of components), too many processes (which reduces the capacity) and high film thickness (which increases the cost of manufacturing).

A related art has disclosed a method for manufacturing an insulating layer in an MIM (metal-insulator-metal) capacitor, wherein, ethyl orthosilicate and ozone gas are heat reacted on a lower electrode plate of the MIM capacitor to form a silicon dioxide insulating layer. With the adoption of the method, a silicon dioxide insulator is manufactured by a deposition method without containing plasma auxiliary enhancement on a lower metal pole plate of the MIM capacitor manufactured by the conventional method, an upper metal pole plate of the MIM capacitor is continuously manufactured by the conventional method after the insulator is formed, and finally the MIM capacitor is formed. In the method, the preparation method is simplified, and the MIM capacitor adopting the insulating layer has higher performances on breakdown voltage, leakage current, and the like.

Another related art uses the process of Al thin film deposition, linkage, ion implantation and bonding heat treatment to prepare the substrate in SOI structure with the buried layer of two or the multiple layer chosen from aluminum nitride, alumina, or AIN, $Al_2O_3$, $Si_3N_4$ or $SiO_2$. The manufacturing steps are that as follows: depositing Al thin film on the wafer; realizing the transfusion of the layer by the linkage process; forming the buried layer by N ions or O ions implantation.

Another related art has disclosed a buffer layer and method of forming the buffer layer, the method including forming a high-k dielectric layer; forming a titanium nitride layer over the high-k dielectric layer; forming a silicon layer on the titanium nitride layer; annealing the silicon layer in the titanium nitride layer to form an annealed silicon layer and forming an n-metal over the high-k dielectric layer. Consequently, it did not solve the problem of the cross contamination in LTPS.

SUMMARY OF THE INVENTION

An embodiment of the present disclosure is directed toward a method of forming a buffer layer in a LTPS products, which is capable of avoiding the cross contamination caused by multi-layers structure in LTPS products, and promoting all electrical characteristics thereof.

A method of forming a buffer layer in a LTPS product, comprising:

(a) providing a LTPS product comprising a substrate, with alkali metal ions therein;

(b) diffusing the alkali metal ions to the surface of the substrate;

(c) eliminating the alkali metal ions on the surface of the substrate; and (d) forming the buffer layer on the substrate.

According to one embodiment of the present disclosure, wherein the step of diffusing the alkali metal ions is operated by oven heating, rapid thermal annealing, or chamber heating to heat the substrate.

According to one embodiment of the present disclosure, wherein temperature range in the step of heating the substrate is from 580° C. to 700° C.

According to one embodiment of the present disclosure, wherein an acid with low concentration is used to eliminate K ions and Na ions on the surface of the substrate.

According to one embodiment of the present disclosure, wherein the concentration of the acid is more than or equal to 4 ppm.

According to one embodiment of the present disclosure, wherein the acid is selected from the group consisted of acetic acid, phosphoric acid and carbonic acid to pickle the substrate.

According to one embodiment of the present disclosure, wherein the substrate is a transparent glass substrate or a transparent quartz substrate.

According to one embodiment of the present disclosure, further comprising:

an initial clean step before the step of diffusing the alkali metal ions; and a pre-clean step to the substrate after the step of eliminating the alkali metal ions on the surface of the substrate, which is for removing the remaining pickling solution.

According to one embodiment of the present disclosure, further comprising:

annealing the buffer layer to optimize the quality of the buffer layer.

According to one embodiment of the present disclosure, wherein the buffer layer is a single layer structure, which comprises SiOx without SiNx.

DETAILED DESCRIPTION

Hereinafter, certain exemplary embodiments according to the present disclosure will be described with reference to the accompanying drawings.

DETAILED DESCRIPTION

Figure 1:
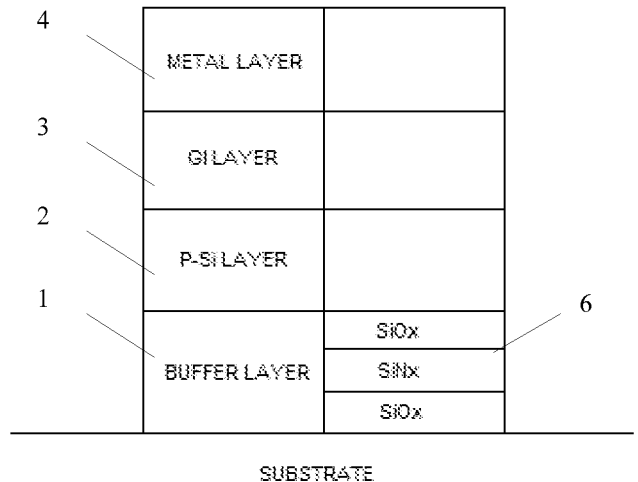
FIG. 1 shows a structure diagram of the buffer layer with triple structure in the related art.

The present invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the term "plurality" means a number greater than one.

Hereinafter, certain exemplary embodiments according to the present disclosure will be described with reference to the accompanying drawings.

Figure 3:
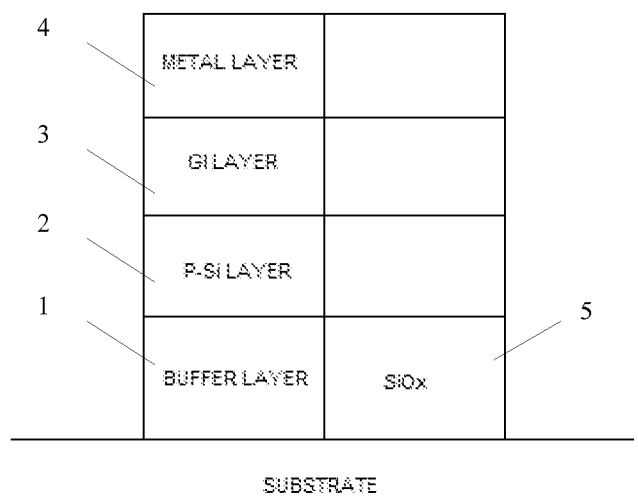
FIG. 3 shows a structure diagram of the new buffer layer in the embodiment of the present disclosure.

The thickness of the substrate in FIG. 3 generally can reach up to 0.3 mm to 0.7 mm, and it can be the transparent materials such as glass substrate or quartz substrate. Before forming the buffer layer 1 in the figure, a process of initial clean will be performed to clean the large particles on the glass or quartz substrate. The expected value of the cleanliness shall meet the standard that the quantity of particles on per unit area is not higher than 300 ea (generally refers to the particles with radius≥1 um). What should be noticed is that, on the macroscopic angle, just some of the particles on the outside surface of the substrate can be cleaned by the cleaning step. Actually, the pollutants on the substrate are not only the particles on the surface of the substrate. In the standard manufacturing process of the substrate, on the microcosmic angle, the substrate unavoidably contains the pollutants, such as alkali metal ions, due to one of its physical characteristics. This defect causes such hazardous material easily randomly diffuses outward when under the high temperature condition. Once such alkali metal ions invade into the thin film layer of polysilicon which will be deposited on the substrate afterward, the adverse effects will occur and this is what we urges to avoid. To solve this recurring illness, one effective method is to adopt plasma enhanced chemical vapor deposition (PECVE) to deposit a buffer layer 1 as the barrier layer against the migration of alkali metal ions.

As the description of the related art, when only use $SiO_2$ as the insulating layer, the alkali metal ions, such as Ca, Ng, Ba, can be effectively separated to less than $10^{15}$ by a 800 Å $SiO_2$ insulating layer. However, the effect of separating ions K and Na is poor that a 3000 Å insulating layer must be adopt to separate K ions and Na ions to less than $10^{15}$. This means based on the current technical level, if adopting $SiO_2$ as the insulating layer, the parameter of thickness will be sacrificed, and a lot of inconvenience such as stress matching problem will be caused by the thick buffer layer 1.

Figure 2:
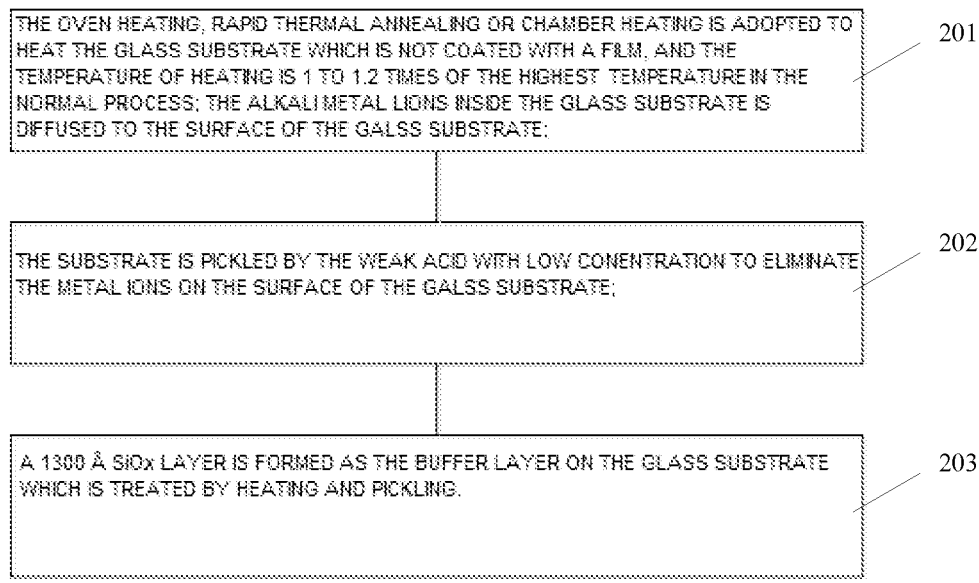
FIG. 2 shows a flow diagram of forming the buffer layer in the embodiment of the present disclosure.

In view of the problem above mentioned, as shown in FIG. 2, in order to promote the stability of the electrical properties of the thin-film transistor, a preferred method provided consists of the following steps, 101: OVEN, Rapid Thermal Annealing (RTA) or Heating-Chamber can be adopted to raise the temperature of the substrate to 1 to 1.2 times of the highest temperature in the normal process, and this temperature condition is used to preheat the substrate. In one preferred embodiment of the present disclosure, the temperature of the heating is in the scope from 580° C. to 700° C. The step of heating can reduce the shrinkage/warpage during the process of treating the glass substrate. The method of diffusion is used to drive the alkali metal ions to the exposed surface of the substrate, which makes it convenient to eliminate the alkali metal ions.

Next, 202: performing the acid pickling process by adopting the low concentration weak acid, such as the acetic acid, phosphoric acid or carbonic acid, to pickle the glass. Because the glass substrate generally belongs to the alkali glass, it will not be corroded by the weak acid. Hence, it is possible to use the acid pickling process to treat the glass to mainly eliminate the K ions and Na ions. In some preferred embodiments of the present disclosure, it is possible to adopt the weak acid whose concentration is not lower than 4 ppm to pickle the glass layer.

203: After the two processes of heating and pickling, a thin SiOx layer 5 with the thickness around the scope of 1000 Å to 1500 Å could be deposited as the buffer layer 1. For example, in a preferred embodiment, the preferred thickness of the buffer layer 1 is 1300 Å. Obviously, in the embodiment of the present disclosure, the buffer layer 1 is a single $SiO_2$ layer, not the traditional composite layer constituted by SiNx and SiOx or other material. Furthermore, after finishing the acid pickling process of the substrate, and before depositing the buffer layer 1, it is necessary to perform a pre-clean process to the substrate. On one hand, to eliminate the remaining pickler, on the other hand, to take away the hazardous material dissolved in the pickler in maximum, to prevent the pollution or other unfavourable factors caused by the pickler from the following processes. Alternatively, after forming the buffer layer 1, the annealing is also performed to the buffer layer 1 to optimize the quality of the buffer layer 1. The defect mode of $SiO_2$ is much better than that of SiNx and it is easy to prevent. Furthermore, compared with the stress match between SiNx and the substrate, the stress match between $SiO_2$ and substrate is easier to reach the best performance.

After finishing the above mentioned processes, glass or quartz substrate is putting in to manufacturing according to the standard processes. For example, creating the amorphous silicon layer (α-Si) on the buffer layer 1 by PECVD; next, performing the crystallization treatment, such as annealing or solid phase crystallization to the amorphous silicon to convert the amorphous silicon into the polysilicon layer 2 (P—Si). Since the hazardous alkali metal material has been eliminated, the polysilicon layer 2 will not be harmed by the metallic element even under the high temperature condition. And due to the thickness of $SiO_2$ used as the buffer layer 1 where the alkali metal has been eliminated is decreased, the stress between the film and the substrate will be reduced by a certain amount, after the pre-heating process, the glass only have the elastic thermal stress, the inelastic deformation will be reduced and the mobility of $SiO_2$ will be higher, which will make the thin-film transistor component have the better characteristics and the better performance.

Meanwhile, after eliminating the K ions and Na ions, as shown in FIG. 3, the polysilicon (P—Si) layer for forming the transistor unit is formed on the buffer layer 1, and the gate insulation layer 3 (GI) is formed on the polysilicon layer 2, a metal gate formed by the metal layer 4 is formed on the gate insulation layer 3. In the LTPS devices, a SiOx layer 5 of 1300 Å in thickness is used as the buffer layer 1, which will promote the capacity greatly. Moreover, it is not necessary to form SiNx in this buffer layer 1, which can exempt the steps of stabilizing the gas/pressure and avoid the waste of the high cost industrial gases to save a lot of costs. This also equals to promoting the capacity. And a very important point is to avoid the cross contamination caused by the mixture of SiNx/SiOx.

While the present disclosure has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What claimed is:

1. A method of forming a buffer layer in a LTPS product, comprising:
    (a) providing a LTPS product comprising a substrate made with transparent glass or transparent quartz, and having alkali metal ions therein;
    (b) diffusing the alkali metal ions to a surface of the substrate;
    (c) eliminating the alkali metal ions on the surface of the substrate; and
    (d) forming the buffer layer on the substrate.

2. The method as claimed in claim 1, wherein the step of diffusing the alkali metal ions is operated by oven heating, rapid thermal annealing, or chamber heating to heat the substrate.

3. The method as claimed in claim 2, wherein temperature range in the step of heating the substrate is from 580° C. to 700° C.

4. The method as claimed in claim 1, wherein an acid with low concentration is used to eliminate K ions and Na ions on the surface of the substrate.

5. The method as claimed in claim 4, wherein the concentration of the acid is more than or equal to 4 ppm.

6. The method as claimed in claim 4, wherein the acid is selected from the group consisting of acetic acid, phosphoric acid and carbonic acid to pickle the substrate.

7. The method as claimed in claim 1, further comprising:
    an initial clean step before the step of diffusing the alkali metal ions; and
    another clean step to the substrate after the step of eliminating the alkali metal ions on the surface of the substrate, which is for removing remaining pickling solution.

8. The method as claimed in claim 1, further comprising:
    annealing the buffer layer to optimize the quality of the buffer layer.

9. The method as claimed in claim 1, wherein the buffer layer is a single layer structure, which comprises SiOx without SiNx.

\* \* \* \* \*